US012581870B2

(12) United States Patent
Hackley et al.

(10) Patent No.: US 12,581,870 B2
(45) Date of Patent: Mar. 17, 2026

(54) JOSEPHSON JUNCTION DEVICE AND METHOD OF MAKING THE SAME

(71) Applicants: Justin C. Hackley, Catonsville, MD (US); Patrick R. Warner, Hampstead, MD (US)

(72) Inventors: Justin C. Hackley, Catonsville, MD (US); Patrick R. Warner, Hampstead, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 797 days.

(21) Appl. No.: 17/746,724

(22) Filed: May 17, 2022

(65) Prior Publication Data

US 2023/0380300 A1 Nov. 23, 2023

(51) Int. Cl.
| | |
|---|---|
| *H10N 60/12* | (2023.01) |
| *G06N 10/40* | (2022.01) |
| *H10N 60/80* | (2023.01) |
| *H01B 12/04* | (2006.01) |

(52) U.S. Cl.
CPC ............. *H10N 60/12* (2023.02); *G06N 10/40* (2022.01); *H10N 60/805* (2023.02); *H01B 12/04* (2013.01)

(58) Field of Classification Search
CPC ................. H10N 60/805; H10N 60/85; H10N 60/12–126; H10N 60/0912–0941; H10N 99/05; H10N 69/00; H01L 21/0273–0279; H01L 21/285–2885; H01L 21/32058; H01L 21/76891; G06N 10/40; H01B 12/04
See application file for complete search history.

(56) References Cited

U.S. PATENT DOCUMENTS

| | | | |
|---|---|---|---|
| 6,951,985 B1 * | 10/2005 | Lemelson | .......... H10N 60/0128 174/15.4 |
| 10,991,755 B2 | 4/2021 | Ladizinsky et al. | |
| 11,094,873 B2 | 8/2021 | Adiga et al. | |
| 11,641,785 B2 | 5/2023 | Mergenthaler et al. | |

(Continued)

FOREIGN PATENT DOCUMENTS

| | | | | |
|---|---|---|---|---|
| JP | H0794793 A | * | 4/1995 | ............. H01L 39/24 |

OTHER PUBLICATIONS

Bal, et al.: "Overlap junctions for superconducting quantum electronics and amplifiers"; Appl. Phys. Lett. 118, 112601 (2021); https://doi.org/10.1063/5.0048621; Submitted: Feb. 24, 2021 • Accepted: Feb. 25, 2021 • Published Online: Mar. 15, 2021.

(Continued)

*Primary Examiner* — Shahed Ahmed
(74) *Attorney, Agent, or Firm* — Tarolli, Sundheim, Covell & Tummino LLP

(57) ABSTRACT

A Josephson junction (JJ) device is provided. The JJ device comprises an operating JJ, a first hydrogen-trapping JJ having a first end coupled to a first end of the operating JJ and a second end coupled to a first superconductor wire, and a second hydrogen-trapping JJ having a first end coupled to a second end of the operating JJ and a second end coupled to a second superconductor wire. The first hydrogen-trapping JJ and the second hydrogen-trapping JJ mitigates hydrogen diffusion into the operating JJ.

11 Claims, 5 Drawing Sheets

(56) References Cited

U.S. PATENT DOCUMENTS

| | | | |
|---|---|---|---|
| 11,910,730 B2 | 2/2024 | Zhang et al. | |
| 2005/0123674 A1* | 6/2005 | Stasiak | B82Y 40/00 |
| | | | 505/471 |
| 2016/0211438 A1* | 7/2016 | Chang | H10N 60/0912 |
| 2019/0363239 A1 | 11/2019 | Yoscovits et al. | |
| 2022/0037578 A1* | 2/2022 | Rodbell | G03F 7/038 |

OTHER PUBLICATIONS

Dolan: "Offset masks for lift-off photoprocessing"; Appl. Phys. Lett. 31, 337 (1977); https://doi.org/10.1063/1.89690, Published Online: Aug. 26, 2008.

Kreikebaum, et al.: "Improving wafer-scale Josephson junction resistance variation in superconducting quantum coherent circuits"; IOP Publishing, Superconductor Science and Technology, Supercond. Sci. Technol. 33 (2020) 06LT02 (6pp), https://doi.org/10.1088/1361-6668/ab8617.

Potts, et al.: "CMOS compatible fabrication methods for submicron Josephson junction qubits"; Nanotechnology and Quantum Computing; Article in IEE Proceedings—Science Measurement and Technology • Oct. 2001 DOI: 10.1049/ip-smt:20010395 • Source: IEEE Xplore.

Wu, et al.: "Overlap junctions for high coherence superconducting qubits"; Appl. Phys. Lett. 111, 032602 (2017); https://doi.org/10.1063/1.4993937 Submitted: May 16, 2017 • Accepted: Jun. 30, 2017 • Published Online: Jul. 19, 2017.

WOISR (International Search Report and Written Opinion) for corresponding PCT/US2023/017716, mailed Oct. 21, 2024.

* cited by examiner

JOSEPHSON JUNCTION DEVICE AND METHOD OF MAKING THE SAME

GOVERNMENT INTEREST

The invention was made under Government Contract. Therefore, the US Government has rights to the invention as specified in that contract.

TECHNICAL FIELD

The present invention relates generally to superconductors, and more particularly to a Josephson junction device and a method of making the same.

BACKGROUND

Superconducting circuits are one of the leading technologies being developed for enhancement of communication signal integrity or increasing computing processing power. They are operated at temperatures <100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Furthermore, the need for low temperature processing currently presents one of the more significant barriers to mass production of superconducting devices.

One of the common devices employed in superconducting circuits is a Josephson junction (JJ). JJs have important applications in quantum-mechanical circuits, such as superconducting quantum interference devices (SQUIDs), superconducting quantum bits (Qubits), and rapid single flux quantum (RSFQ) digital electronics. A JJ is a device that consists of two superconductors weakly coupled by a region which may be either non-superconducting or a weaker superconductor. For example, one type of JJ consists of two superconductors separated by a thin insulating barrier. The JJ has a critical current, which is the maximum supercurrent that the junction can sustain without dissipation. Current below the critical current causes the junction phase to change. It is important to maintain a consistent critical current for the JJ for the application employing the JJ to operate properly. It is well known that the Ic (critical current) of JJs can drift over time. This effect is known as junction aging and can have a deleterious effect on the consistent operation of the JJ application.

SUMMARY

In one example, a Josephson junction (JJ) device is provided. The JJ device comprises an operating JJ, a first hydrogen-trapping JJ having a first end coupled to a first end of the operating JJ and a second end coupled to a first superconductor wire, and a second hydrogen-trapping JJ having a first end coupled to a second end of the operating JJ and a second end coupled to a second superconductor wire. The first hydrogen-trapping JJ and the second hydrogen-trapping JJ mitigates hydrogen diffusion into the operating JJ.

In one example, a method of forming a Josephson Junction (JJ) device is provided. The method comprises forming a photoresist material layer over a substrate to form a JJ structure, patterning the photoresist material layer to form openings in the photoresist material layer and a photoresist bridge near a central region of the JJ structure, performing a first angular superconducting deposition process on the JJ structure to form a plurality of superconductor bottom electrodes on the substrate, and performing an oxidation process to provide an oxidized top surface on the plurality of superconductor bottom electrodes. The method further comprises performing a second angular superconducting deposition process on the JJ structure to form a plurality of superconductor top electrodes with an overlapping portion of one of the plurality of superconductor top electrodes overlapping one of the plurality of superconductor bottom electrodes with an oxidized top surface therebetween to form a JJ below the photoresist bridge near the central region of the JJ structure, performing an oxidizing process to form a protective oxide on the JJ, and removing the photoresist material layer to provide a final resulting JJ structure.

DETAILED DESCRIPTION

The present disclosure is directed to a Josephson junction (JJ) device and a method of making the same. The JJ device is fabricated with elements that facilitate the hardening of an operating JJ against aging that could change the critical current (Ic) of the operating junction over time. The JJ device is configured to be part of a microwave circuit. The JJ device includes two additional hydrogen trap JJs which are inserted in series with an operating JJ with a first hydrogen-trapping JJ inserted on a first side of the operating JJ and a second hydrogen-trapping JJ inserted on a second side of the operating JJ. The hydrogen-trapping JJs are designed with a critical current that is much greater than the operating JJ and do not affect the function of the microwave circuit. These large junctions "sandwich" the operating JJ and act as a hydrogen trap to protect the device junctions from hydrogen diffusing of superconducting (e.g., Niobium) wiring that couples the hydrogen-trapping JJs to other portions of the microwave circuit. Furthermore, additional processes are employed to harden the operating JJ against aging. The additional processes include a post-junction oxidation process carried out after the operating JJ is formed.

In one example, the JJ device includes a shadow evaporated aluminum (AL) based superconducting JJ (e.g., Al/aluminum-oxide(AlOx)/Al) as the operating JJ incorporated into the operating JJ structure. The operating JJ is age hardened by a combination of hydrogen trapping via two additional hydrogen trap JJs and a robust oxide barrier that protects the operating JJ from multiple aging mechanisms. The overall JJ device can be oxidized by the same process that is used to form the AlOx barrier that forms the insulating layer of the operating JJ. Shadow evaporated Al/AlOx/Al Josephson junctions are the academic standard for building low Ic superconducting qubit circuits. However, the inherent instability and Ic drift over time prohibits using this style of junction in anything other than an academic experiment. The above-stated hardening techniques mitigate the instability of the Ic drift over time to allow the device to operate in devices outside the academic environment.

Figure 1:
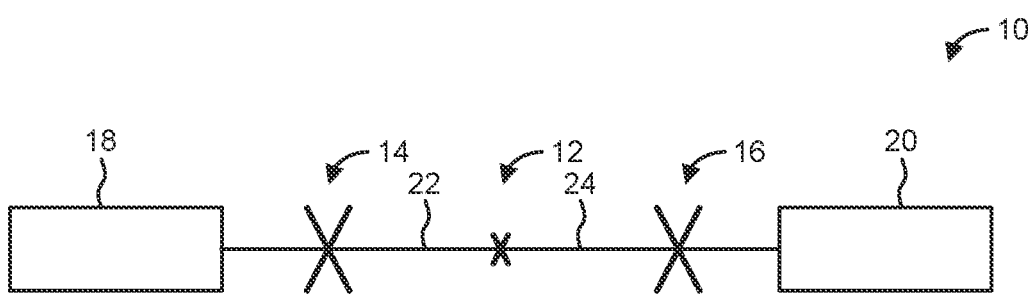
FIG. 1 illustrates a schematic diagram of an example JJ device.

FIG. 1 illustrates a schematic diagram of an example JJ device 10. The JJ device 10 includes a first hydrogen-trapping JJ 14 having a first end coupled to a first end of an operating JJ 12 and a second hydrogen-trapping JJ 16 having a first end coupled to a second end of the operating JJ 12. The first hydrogen-trapping JJ 14 is coupled on a second end to a first superconductor wire 18 (e.g., niobium) configured to be coupled to one or more microwave circuits and the second hydrogen-trapping JJ 16 is coupled on a second end to a second superconductor wire 20 configured to be coupled to one or more microwave circuits. In one example, the first and second hydrogen-trapping JJs 14 and 16 are greater than or equal to 100× the size of the operating JJ 12. The first and second hydrogen-trapping JJs 14 and 16 are inserted as a hydrogen barrier between the operating JJ 12 and the superconductor wires 18 and 20 in a microwave circuit. Hydrogen diffusing out from superconductor wiring will typically accumulate at the superconducting junction barrier and decrease the electronic barrier height, which increases the junction Ic over time. The larger hydrogen-trapping JJs 14 and 16 are intended to trap hydrogen and prevent accumulation at the more sensitive operating JJ 12, hereby stabilizing the junction Ic of the operating JJ 12.

The operating JJ 12 and the hydrogen-trapping JJs 14 and 16 can be connected to one another via superconductor lines 22 and 24 (e.g., aluminum conductive lines) and connectable or connected to a microwave circuit via superconductor wires 18 and 20 to form the JJ device 10. The elements of the JJ device 10 can be formed sequentially under vacuum on a wafer to form the JJ device 10. The wafer can then be subjected to an additional oxidation process, in the same process chamber that forms the elements of the JJ device 10, to form a robust, high quality native oxide on the surface of the JJ device 10. When the wafer is removed from the vacuum chamber, the surface is immediately exposed to water vapor and organic contaminants in atmosphere. The robust native oxide passivates the surface and prevents diffusion of contaminants to the tunnel barrier region of the operating JJ 12, hereby stabilizing the Ic of the operating JJ 12.

Turning now to FIGS. 2-13, fabrication is discussed in connection with formation of a JJ structure that includes an operating JJ of FIG. 1. It is to be appreciated that the present example is discussed with respect to a process flow that shows the formation of a JJ structure that includes an operating JJ but could similarly be employed to fabricate a JJ structure that includes a first hydrogen-trapping JJ or a second hydrogen-trapping JJ. Additionally, the first hydrogen-trapping JJ, the second hydrogen-trapping JJ and the operating JJ can be fabricated sequentially or concurrently employing the same process duplicated for all three JJs with the first hydrogen-trapping JJ and the second hydrogen-trapping JJ having different dimension than the operating JJ to provide for the larger critical current of the first hydrogen-trapping JJ and the second hydrogen-trapping JJ relative to the operating JJ.

Figure 2:
FIG. 2 illustrates a cross-sectional view of a JJ structure in its early stages of fabrication.
Figure 3:
FIG. 3 illustrates a plan view of the JJ structure of FIG. 2.
Figure 4:
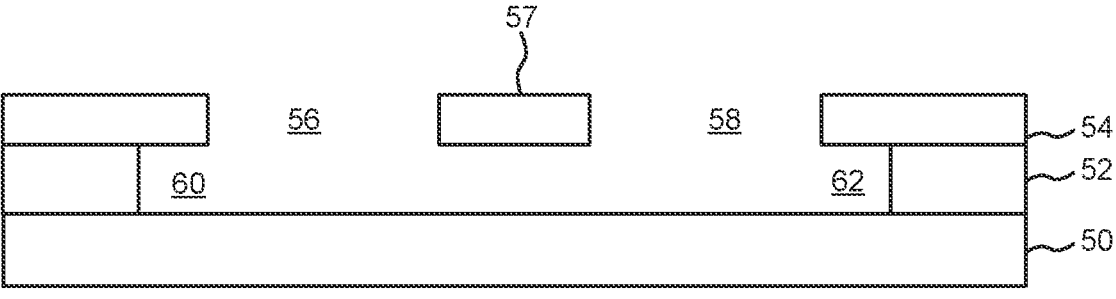
FIG. 4 illustrates a cross-sectional view of the JJ structure of FIGS. 2-3 after a photoresist patterning process.
Figure 5:
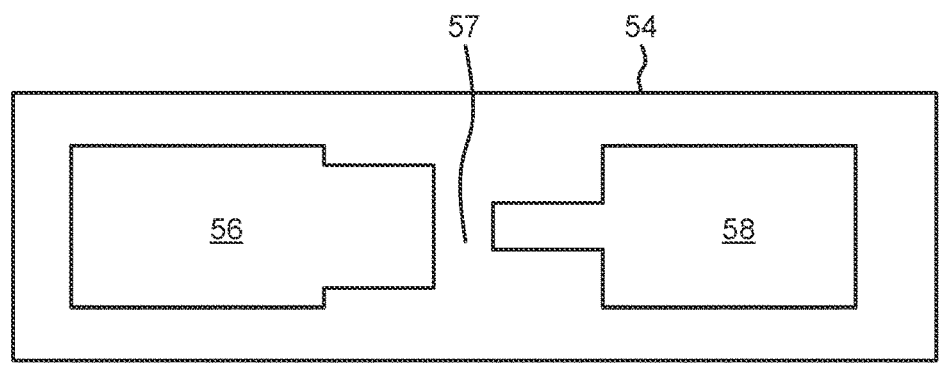
FIG. 5 illustrates a plan view of the structure of FIG. 4.

FIG. 2 illustrates a cross-sectional view of a JJ structure in its early stages of fabrication. FIG. 3 illustrates a plan view of the JJ structure of FIG. 2. The JJ structure includes a first photoresist material layer 52 overlying a substrate 50, and a second photoresist material layer 54 overlying the first photoresist material layer 52. The substrate 50 can be, for example, a silicon or glass wafer that provides mechanical support for the formation. The first photoresist material layer 52 is a lift-off resist material, and the second photoresist material layer 54 is a standard photoresist material layer. The first photoresist material layer 52 and the second photoresist material layer 54 are then patterned and developed to expose trench openings 56 and 58 in the first photoresist material layer 52 and the second photoresist material layer 54 in accordance with a trench pattern. A central bridge 57 (e.g., Dolan bridge) is formed between the trench opening 56 and the trench opening 58. The resultant structure is shown in the cross-sectional view of FIG. 4. The first photoresist material layer 52 is configured to be undercut by the photoresist material developer employed during the patterning and developing process to provide the resultant undercut regions 60 and 62. FIG. 5 illustrates a plan view of the structure of FIG. 4.

The first photoresist material layer 52 and the second photoresist material layer 54 can have a thickness that varies in correspondence with the wavelength of radiation used to pattern the first photoresist material layer 52 and the second photoresist material layer 54. The first photoresist material layer 52 may be formed over the substrate 50 and the second photoresist material layer 54 may be formed over the first photoresist material layer 52 via spin-coating or spin casting deposition techniques, selectively irradiated (e.g., via deep ultraviolet (DUV) irradiation) and developed to form the trench openings 56 and 58, the central bridge 57 and undercut regions 60 and 62.

Figure 6:
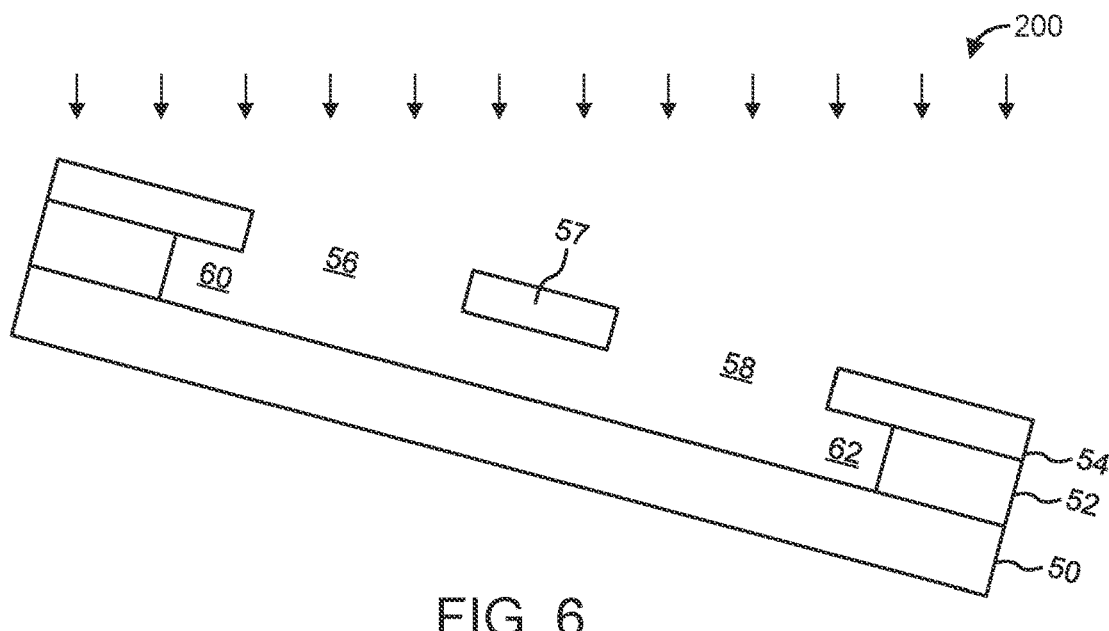
FIG. 6 illustrates a cross-sectional view of the JJ structure of FIGS. 4-5 undergoing a first angular deposition process.
Figure 7:
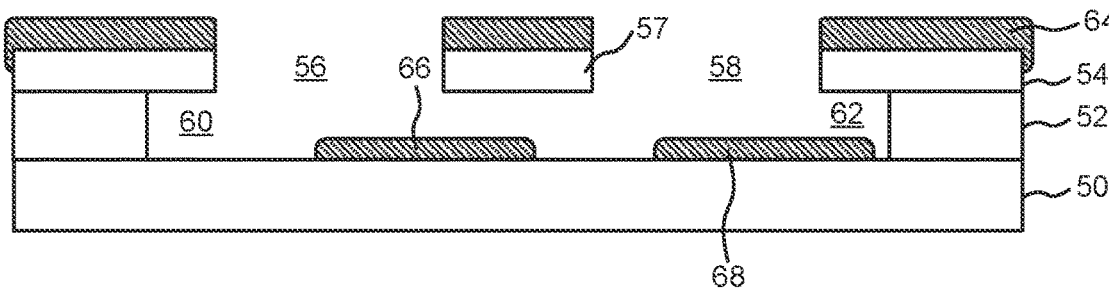
FIG. 7 illustrates a cross-sectional view of the JJ structure of FIG. 6 after undergoing the first angular deposition process.

The JJ structure can then be placed in a deposition process chamber under vacuum. Next as illustrated in FIG. 6, a first angular superconducting deposition process 200 is performed on the structure of FIG. 5. The angle of the angular superconducting deposition process can be achieved by rotating the JJ structure at an angle of rotation of about 30° to about 60° (e.g., 45°) counterclockwise relative to the superconducting deposition source. That is the angle of the incoming superconductor metal comes in at an angle of about 30° to about 60° relative to the top surface of the JJ structure. The deposition process 200 can be performed by a variety of different deposition processes such as sputter deposition of, for example, aluminum to form a first superconductor bottom electrode 66 and a second superconductor bottom electrode 68. The deposition process 200 can be a superconductor metal evaporation process such as evaporation of aluminum to form the first superconductor bottom electrode 66 and the second superconductor bottom electrode 68. The resultant structure is shown in FIG. 7.

Figure 8:
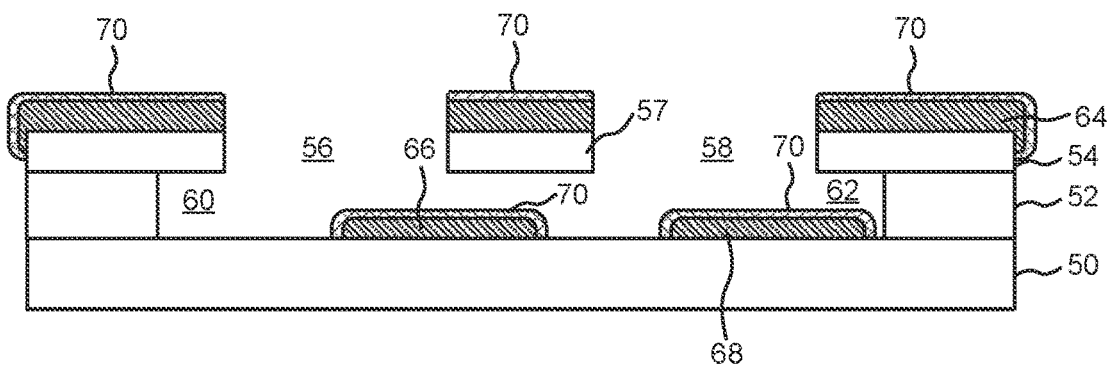
FIG. 8 illustrates a cross-sectional view of the JJ structure of FIG. 7 after undergoing an oxidation process.

Next, the top surfaces of the first superconductor bottom electrode 66 and the second superconductor bottom electrode 68 are oxidized to form an oxidized top surface 70 over the first superconductor bottom electrode 66 and the second superconductor bottom electrode 68, as illustrated in FIG. 8. The JJ structure can be placed in an oxidation chamber and undergo and oxidation process to form the oxidized top surface 70 over the first superconductor bottom electrode 66 and the second superconductor bottom electrode 68. The oxidization chamber can be the same or different chamber as than the deposition chamber as long as the JJ structure remains under vacuum in a clean environment. The oxidized top surface 70 of the superconductor metal that overlies the second photoresist material layer 54 is also oxidized during the oxidization process. In one example, the oxidized top surface 70 is aluminum oxide formed by oxidizing the top surface of the first superconductor bottom electrode 66 and the second superconductor bottom electrode 68, which is formed from aluminum.

Figure 9:
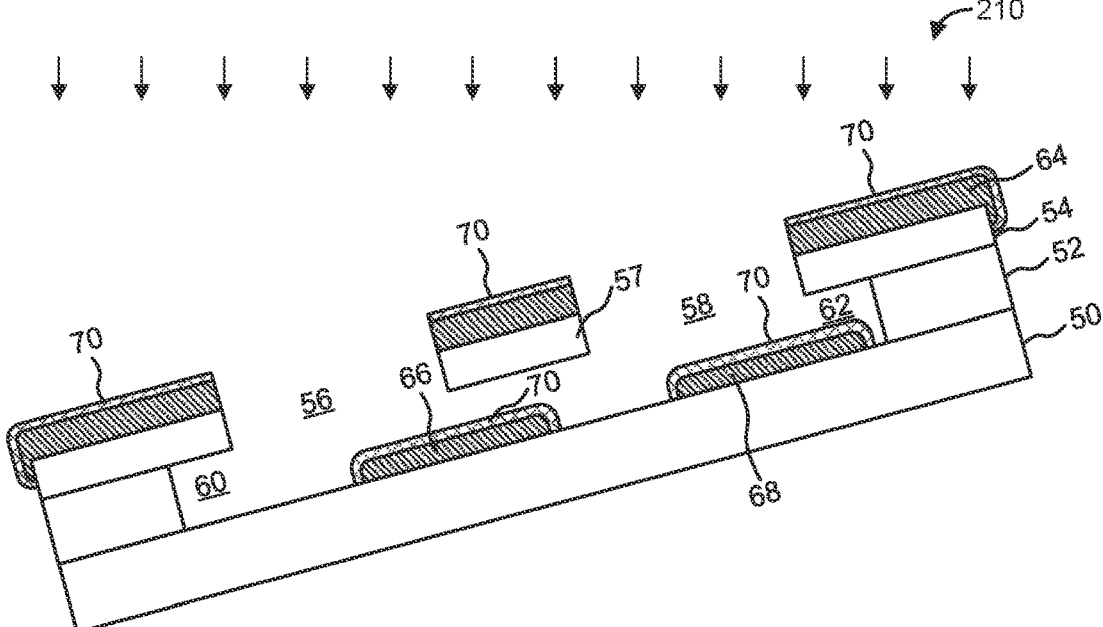
FIG. 9 illustrates a cross-sectional view of the JJ structure of FIG. 8 undergoing a second angular deposition process.

Next as illustrated in FIG. 9, a second angular superconducting deposition process 210 is performed on the structure of FIG. 8. The angle of the angular superconducting deposition process can be achieved by rotating the JJ structure at an angle of rotation of about 30° to about 60° clockwise relative to the superconducting deposition source. That is the angle of the incoming superconductor metal comes in at an angle of about 30° to about 60° relative to the top surface of the JJ structure. The deposition process can be performed by a variety of different deposition processes such as sputter deposition of, for example, of aluminum to form a first superconductor top electrode 73, a second superconductor top electrode 75, and a third superconductor top electrode 77 as shown in the resultant structure of FIG. 10. The second angular superconducting deposition process 210 can be a superconductor metal evaporation process such as evaporation of aluminum to form the first superconductor top electrode 73, the second superconductor top electrode 75, and the third superconductor top electrode 77.

Figure 10:
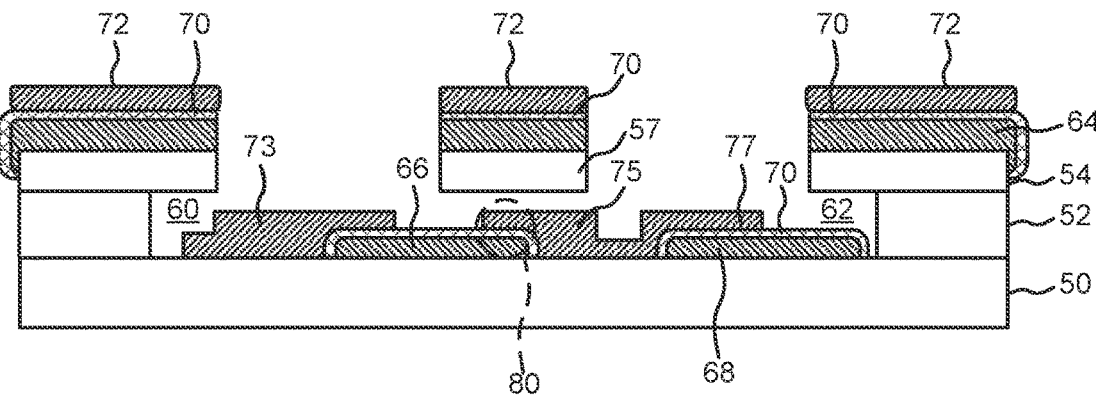
FIG. 10 illustrates a cross-sectional view of the JJ structure of FIG. 9 undergoing a second angular deposition process.

As illustrated in FIG. 10, an operating JJ 80 is formed between overlapping portions of the first superconductor bottom electrode 66 and the second superconductor top electrode 75 with an oxidized portion 70 being disposed in between the first superconductor bottom electrode 66 and the second superconductor top electrode 75 under the central bridge region. In the aluminum/aluminum oxide/aluminum example, a thin oxidized aluminum (oxidized portion 70) forms the tunnel barrier and the aluminum layers (the first superconductor bottom electrode 66 and the second superconductor top electrode 75) on both sides sets the gap voltage of the operating JJ 80.

Figure 11:
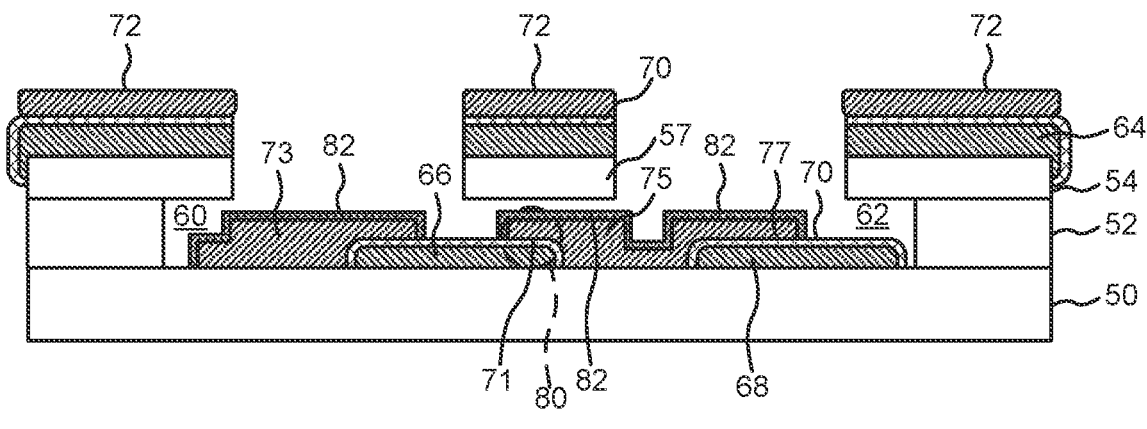
FIG. 11 illustrates a cross-sectional view of the JJ structure of FIG. 10 after undergoing an oxidation process.

After the second superconductor deposition process shown in FIG. 9, the resultant JJ structure shown in FIG. 10 is placed in an oxidation chamber prior to exposure to atmosphere. Again, the oxidation chamber can be the same or different as the deposition chamber and the oxidation chamber as previously mentioned, as long as the JJ structure remains under vacuum in a clean environment. The JJ structure is then oxidized in the same manner that the oxide barrier is formed, but with a much higher exposure of about 450 torr to about 850 torr (e.g., about 650 torr) for about 1 hour to about 3 hours (e.g., about 2 hours). This process forms a robust, high-quality protective oxide layer 82 on the surface of the first superconductor top electrode 73, the second superconductor top electrode 75, and the third superconductor top electrode 77 over the operating JJ 80, which inhibits the diffusion of oxygen or other impurities to the oxide barrier 71 of the operating JJ 80. The resultant structure is illustrated in FIG. 11.

For the aluminum/aluminum oxide/aluminum example, the first superconductor bottom electrode 66, the AlOx tunnel barrier 71, and the second superconductor top electrode 75 are all formed sequentially under vacuum. The JJ structure is then subjected to an additional oxidation step in the same process chamber which forms a robust, high quality native oxide on the Al surface. When the JJ structure is removed from the vacuum chamber the surface is immediately exposed to water vapor and organic contaminants in atmosphere. The robust native oxide passivates the Al surfaces and prevents diffusion of contaminants to the tunnel barrier region, hereby stabilizing the Ic of the operating JJ.

Figure 12:
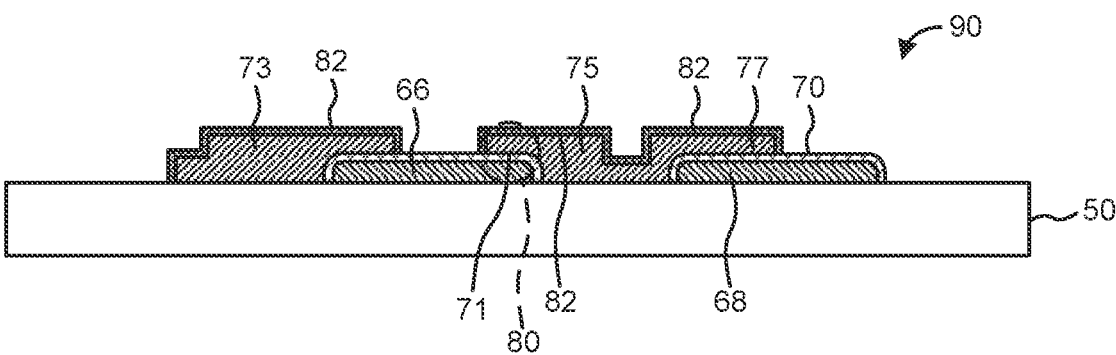
FIG. 12 illustrates a cross-sectional view of the JJ structure of FIG. 11 after removal of the first and the second photoresist material layer.
Figure 13:
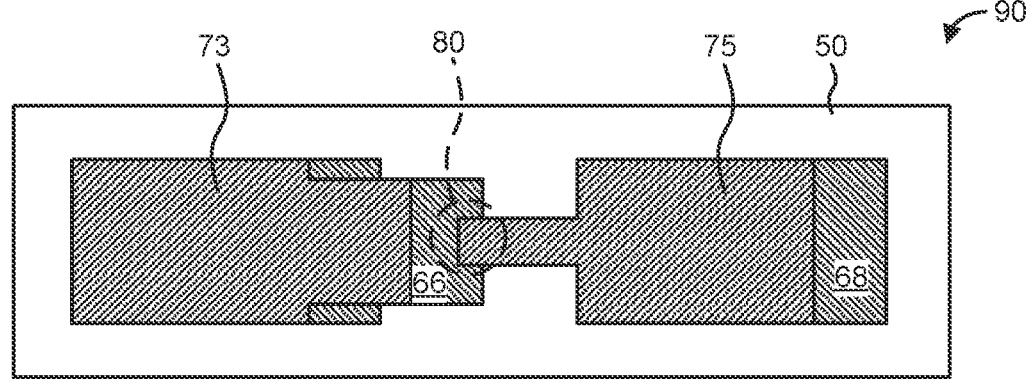
FIG. 13 illustrates a plan view of the structure of FIG. 12.

Next, the first photoresist material layer 52 and the second photoresist material layer 54 are removed from the JJ structure to provide a resultant final JJ structure 90 of FIG. 12. FIG. 13 is a top plan view of the cross-sectional view of FIG. 12. The first photoresist material layer 52 and second photoresist material layer 54 can be removed via a lift-off process. Alternatively, the first photoresist material layer 52 and/or the second photoresist material layer 54 can be removed via a stripping process, for example, ashing in an O₂ plasma.

As previously stated, the process flow that shows the formation of the operating JJ shown in FIGS. 2-13 could similarly be employed to fabricate the first hydrogen-trapping JJ or the second hydrogen-trapping JJ with larger dimensions. Additionally, the first hydrogen-trapping JJ, the second hydrogen-trapping JJ and the operating JJ can be fabricated concurrently employing the same process duplicated for all three JJs with the first hydrogen-trapping JJ and the second hydrogen-trapping JJ having larger dimension than the operating JJ to provide for the larger critical current of the first hydrogen-trapping JJ and the second hydrogen-trapping JJ relative to the operating JJ.

Figures 14, 15:
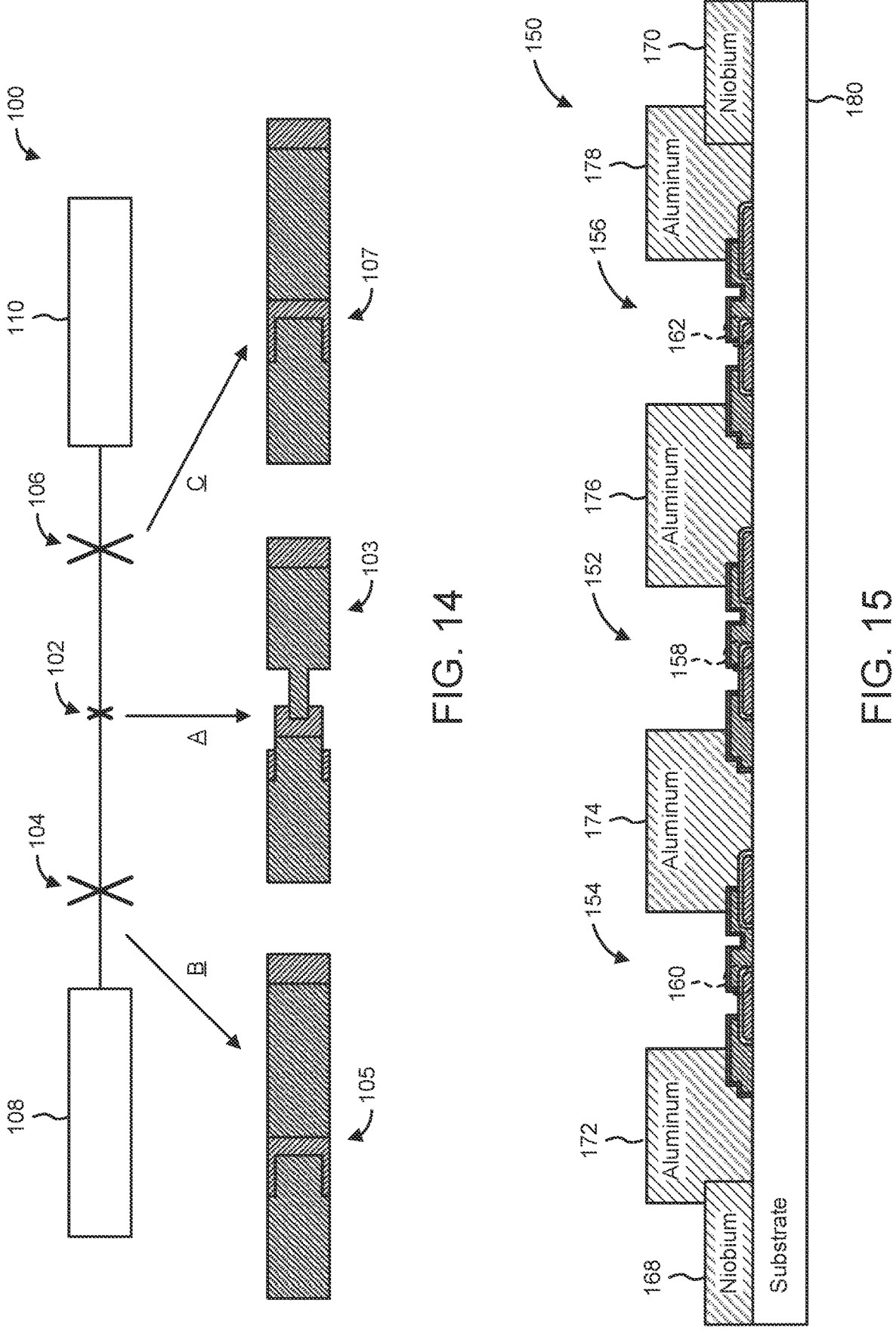
FIG. 14 illustrates a schematic diagram of an example JJ device with arrows to JJ structures that form the JJ device.
FIG. 15 illustrates a cross-sectional diagram of an example JJ device with JJ structures coupled via conductive lines.

FIG. 14 illustrates a schematic diagram of an example JJ device 100. The JJ device 100 includes a first hydrogen-trapping JJ 104 having a first end coupled to a first end of an operating JJ 102 and a second hydrogen-trapping JJ 106 having a first end coupled to a second end of the operating JJ 102. The first hydrogen-trapping JJ 104 is coupled on a second end to a first superconductor wire 108 (e.g., niobium) configured to be coupled to one or more microwave circuits and the second hydrogen-trapping JJ 106 is coupled on a second end to a second superconductor wire 110 configured to be coupled to one or more microwave circuits. As shown in FIG. 14, a first arrow A points to a plan view of a JJ structure 103, similar to the structure shown in FIG. 13, that includes the operating JJ 102. Additionally, a second arrow B points to a plan view of a JJ structure 105, similar to the structure shown in FIG. 13, that includes a first hydrogen-trapping JJ 104. Furthermore, a third arrow C points to a plan view of a JJ structure 106, similar to the structure shown in FIG. 13, that includes a first hydrogen-trapping JJ 106. This shows that each of the JJ structures 103, 105 and 107 can be formed from the process shown FIGS. 2-13 sequentially or concurrently. FIG. 14 illustrates that the JJ structures 105 and 107 are larger than the JJ structure 103.

FIG. 15 illustrates a cross-sectional diagram of an example JJ device 150. The JJ device 150 includes a first hydrogen-trapping JJ structure 154 having a first end coupled to a first end of an operating JJ structure 152 via a superconductor line 174 and a second hydrogen-trapping JJ structure 156 having a first end coupled to a second end of the operating JJ structure 152 via a superconductor line 176. The first hydrogen-trapping JJ structure 154 is coupled on a second end to a first superconductor wire 168 via a super-conductor line 172 and the second hydrogen-trapping JJ 156 is coupled on a second end to a second superconductor wire 170 via a superconductor line 178. The operating JJ structure 152, the first hydrogen-trapping JJ structure 154, and the second hydrogen-trapping JJ structure 156 each reside over a substrate along with superconductor lines 172, 174, 176 and 178 and first and second superconductor wires 168 and 170.

The operating JJ structure 152 includes an operating JJ 158, the first hydrogen-trapping JJ structure 154 includes a first hydrogen-trapping JJ 160, and the second hydrogen-trapping JJ structure 156 includes a second hydrogen-trap-ping JJ 162. The first superconductor wire 168 and the second superconductor wire can be formed of, for example, niobium. The superconductor line 172, 174, 176 and 178 can be formed of, for example, aluminum. In one example, the first and second hydrogen-trapping JJs 160 and 162 are greater than or equal to 100× the size of the operating JJ 158. The first and second hydrogen-trapping JJs 160 and 162 are inserted as a hydrogen barrier between the operating JJ 158 and the superconductor wires 168 and 170 in a microwave circuit. Hydrogen diffusing out from superconductor wiring will typically accumulate at the operating junction barrier and decrease the electronic barrier height, which increases the junction Ic over time. The large hydrogen-trapping JJs 160 and 162 are intended to trap hydrogen and prevent accumulation at the sensitive operating JJ 158, hereby stabilizing the junction Ic of the operating JJ 158. A post-junction oxidation layer (not shown) can be formed over the operating JJ 158 to further mitigate instability of the Ic drift over time of the operating JJ.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a Josephson Junction (JJ) device, the method comprising:
  forming a photoresist material layer over a substrate to form a JJ structure;
  patterning the photoresist material layer to form openings in the photoresist material layer and a photoresist bridge near a central region of the JJ structure;
  performing a first angular superconducting deposition process on the JJ structure to form a plurality of superconductor bottom electrodes on the substrate;
  performing an oxidation process to provide an oxidized top surface on the plurality of superconductor bottom electrodes;
  performing a second angular superconducting deposition process on the JJ structure to form a plurality of superconductor top electrodes with an overlapping por-tion of one of the plurality of superconductor top electrodes overlapping one of the plurality of super-conductor bottom electrodes with an oxidized top sur-face therebetween to form a JJ below the photoresist bridge near the central region of the JJ structure;
  performing a dry oxidizing process under vacuum to form a protective oxide on the JJ; and

8 removing the photoresist material layer to provide a final resulting JJ structure.

2. The method of claim 1, wherein the JJ is an aluminum/ aluminum oxide/aluminum JJ, and both the first angular superconducting deposition process and the second angular superconducting deposition process are aluminum evapora-tion processes.

3. The method of claim 1, wherein the forming a photo-resist material layer comprises forming a first photoresist material layer over the substrate, and a second photoresist material layer over the first photoresist material layer, the first photoresist material layer being a lift-off resist material, and the second photoresist material layer being a standard photoresist material layer.

4. The method of claim 1, wherein the JJ structure is an operating JJ structure and the JJ is an operating JJ, and further comprising forming a first hydrogen-trapping JJ structure having a first end coupled to a first end of the operating JJ structure and a second end coupled to a first superconductor wire, and a second hydrogen-trapping JJ structure having a first end coupled to a second end of the operating JJ structure and a second end coupled to a second superconductor wire, wherein the first hydrogen-trapping JJ structure include a first hydrogen-trapping JJ and the second hydrogen-trapping JJ structure includes a second hydrogen-trapping JJ, the first hydrogen-trapping JJ and the second second hydrogen-trapping JJ mitigates hydrogen diffusion into the operating JJ.

5. The method of claim 4, wherein the first hydrogen-trapping JJ structure and the second hydrogen-trapping JJ structure are formed from the same sequential processes as the operating JJ structure.

6. The method of claim 4, wherein the first hydrogen-trapping JJ, and the second hydrogen-trapping JJ each have a size that is greater than or equal to 100 times the size of the operating JJ.

7. The method of claim 4, wherein the operating JJ structure, the first hydrogen-trapping JJ structure and the second hydrogen-trapping JJ structure are formed concur-rently with the same sequential processes as the operating JJ structure employing the same photoresist material.

8. The method of claim 4, depositing a first superconduc-tor line, a second superconductor line, a third superconduc-tor line and a fourth superconductor line, wherein the first hydrogen-trapping JJ structure has a first end connected to a first end of the operating JJ structure via the first supercon-ductor line and a second end connected to the first super-conductor wire via the second superconductor line, and a second hydrogen-trapping JJ structure having a first end connected to a second end of the operating JJ structure via the third superconductor line and a second end connected to the second superconductor wire via the fourth superconduc-tor line.

9. The method of claim 8, wherein the first superconduc-tor line, the second superconductor line, the third supercon-ductor line and the fourth superconductor line are formed from aluminum.

10. The method of claim 9, wherein the first supercon-ductor wire and the second superconductor wire are formed from niobium.

11. The method of claim 1, wherein each of the perform-ing the first angular superconducting deposition process on the JJ structure, performing the oxidation process to provide the oxidized top surface, performing the second angular superconducting deposition process on the JJ structure, and the performing the dry oxidizing process to form the protective oxide on the JJ is performed under the vacuum in a same processing chamber.

\* \* \* \* \*